United States Patent
Lee

(10) Patent No.: US 11,774,510 B2
(45) Date of Patent: Oct. 3, 2023

(54) APPARATUS AND METHOD FOR DETECTING LOW-VOLTAGE DEFECTIVE BATTERY CELL

(71) Applicant: LG ENERGY SOLUTION, LTD., Seoul (KR)

(72) Inventor: Tae Ho Lee, Daejeon (KR)

(73) Assignee: LG ENERGY SOLUTION, LTD., Seoul (KR)

(*) Notice: Subject to any disclaimer, the term of this patent is extended or adjusted under 35 U.S.C. 154(b) by 51 days.

(21) Appl. No.: 17/435,155

(22) PCT Filed: Feb. 4, 2020

(86) PCT No.: PCT/KR2020/001630
§ 371 (c)(1),
(2) Date: Aug. 31, 2021

(87) PCT Pub. No.: WO2020/180012
PCT Pub. Date: Sep. 10, 2020

(65) Prior Publication Data
US 2022/0137145 A1   May 5, 2022

(30) Foreign Application Priority Data
Mar. 6, 2019  (KR) .................. 10-2019-0025880

(51) Int. Cl.
*G01R 31/00*   (2006.01)
*G01R 31/389*   (2019.01)
(Continued)

(52) U.S. Cl.
CPC ......... *G01R 31/389* (2019.01); *G01R 31/396* (2019.01); *H01M 10/04* (2013.01);
(Continued)

(58) Field of Classification Search
USPC ................ 324/426, 430, 432–435
See application file for complete search history.

(56) References Cited

U.S. PATENT DOCUMENTS

2013/0088201 A1   4/2013   Iwasawa et al.
2013/0090872 A1*  4/2013   Kurimoto ............... B60L 58/13
                                                      702/63
(Continued)

FOREIGN PATENT DOCUMENTS

EP   2 778 697 A1   9/2014
JP   4606846 B2   1/2011
(Continued)

OTHER PUBLICATIONS

Extended European Search Report for European Patent Application No. 20765631.5, dated Mar. 14, 2022.
(Continued)

*Primary Examiner* — Vincent Q Nguyen
(74) *Attorney, Agent, or Firm* — Birch, Stewart, Kolasch & Birch, LLP

(57) ABSTRACT

A battery pack in accordance with an embodiment may include a battery management system (BMS) controlling the battery pack, the BMS includes an internal resistance value calculation module calculating an internal resistance value for each battery cell directly after the battery pack is charged or discharged for a predetermined time, a maximum internal resistance valued battery cell detection module detecting a battery cell having a biggest internal resistance value of the calculated internal resistance values, and a defective battery cell determination module determining a defective battery cell on the basis of a detected number of time each battery cell has the biggest internal resistance value.

11 Claims, 3 Drawing Sheets

(51) Int. Cl.
    *G01R 31/396*    (2019.01)
    *H02J 7/00*    (2006.01)
    *H01M 10/42*    (2006.01)
    *H01M 10/48*    (2006.01)
    *H01M 10/04*    (2006.01)

(52) U.S. Cl.
    CPC ....... H01M 10/425 (2013.01); H01M 10/482 (2013.01); H02J 7/005 (2020.01); H02J 7/0013 (2013.01); *H01M 2010/4271* (2013.01); *H01M 2220/10* (2013.01)

(56) References Cited

U.S. PATENT DOCUMENTS

| | | | |
|---|---|---|---|
| 2015/0355286 A1* | 12/2015 | Kobayashi | G01R 31/3648 702/63 |
| 2016/0231390 A1* | 8/2016 | Sakakibara | G01R 31/371 |
| 2017/0350946 A1 | 12/2017 | Mukaitani et al. | |
| 2018/0203070 A1* | 7/2018 | Park | H01M 10/48 |
| 2019/0067758 A1 | 2/2019 | Yamada | |
| 2019/0204393 A1 | 7/2019 | Yamada | |

FOREIGN PATENT DOCUMENTS

| | | |
|---|---|---|
| JP | 2013-195129 A | 9/2013 |
| JP | 2018-48893 A | 3/2018 |
| JP | 2018-205313 A | 12/2018 |
| JP | 6471463 B2 | 2/2019 |
| KR | 10-0823188 B1 | 4/2008 |
| KR | 10-1367860 B1 | 2/2014 |
| KR | 10-2016-0080802 A | 7/2016 |
| KR | 10-2018-0085165 A | 7/2018 |
| KR | 10-2018-0114156 A | 10/2018 |

OTHER PUBLICATIONS

International Search Report (PCT/ISA/210) issued in PCT/KR2020/001630 dated May 19, 2020.

* cited by examiner

APPARATUS AND METHOD FOR DETECTING LOW-VOLTAGE DEFECTIVE BATTERY CELL

TECHNICAL FIELD

The present disclosure relates to an apparatus and a method for detecting an undervoltage defective battery cell.

Particularly, the present disclosure relates to an apparatus and a method for preventing a safety accident of a battery pack due to a battery cell deviation by detecting a characteristic of an undervoltage defective battery cell in an early stage.

BACKGROUND ART

A battery pack is an assembly manufactured such that a module is assembled by welding and accommodating a single battery cell in a housing, and then a plurality of modules are connected by a busbar or a wire. In the battery pack, a defect of a battery cell is frequently generated.

When a defect is generated in one of the battery cells of the battery pack, the corresponding battery cell may have an internal resistance (IR) that is extremely varied when charged or discharged.

That is, a voltage higher than a normal battery cell is formed in a charging state, and a voltage lower than the normal battery cell is formed in a discharging state.

Here, when the charging or the discharging is repeatedly performed although an undervoltage defective battery cell is generated, an overall output of the battery pack may be degraded.

Particularly, in case of an energy storage system (ESS) in which a plurality of battery packs are connected, the ESS may not be efficiently used due to a deviation between battery packs of the ESS because one defective battery cell causes reduction in output of the battery pack including the defective battery cell.

Also, when the undervoltage defective battery cell is continuously charged or discharged, short-circuit may be generated in the defective battery cell, and when the short-circuit is generated, ignition or safety limitation may occur.

Thus, in an exemplary embodiment, an apparatus and a method for detecting the undervoltage battery cell in an early stage are suggested.

(Related art document) Korean Registered Patent No. KR 1367860 B1

DISCLOSURE OF THE INVENTION

Technical Problem

The present disclosure provides an apparatus and a method for detecting an undervoltage defective battery cell of battery cells of a battery pack.

The present disclosure also provides a method for safely using a battery pack by detecting an undervoltage defective battery cell in an early stage.

Technical Solution

In accordance with an exemplary embodiment, a battery pack including a plurality of battery cells includes a battery management system (BMS) configured to control the battery pack. Here, the BMS includes: an internal resistance value calculation module configured to calculate an internal resistance value for each battery cell directly after each time the battery pack is charged or discharged during a predetermined period of time; a maximum internal resistance valued battery cell detection module configured to detect a battery cell among the plurality of battery cells having a biggest internal resistance value of the calculated internal resistance values, each time the battery pack is charged or discharged; and a defective battery cell determination module configured to determine a defective battery cell on the basis of a detected number of times each battery cell has the biggest internal resistance value.

The internal resistance value calculation module may repeatedly calculate the internal resistance value directly after the battery pack is charged or discharged for the predetermined period of time.

The maximum internal resistance valued battery cell detection module may detect the battery cell having the biggest internal resistance value of the calculated internal resistance values directly after the battery pack is charged or discharged for the predetermined period of time and count the detected number of the battery cell detected as the battery cell having the maximum internal resistance value, The defective battery cell determination module ma determine the battery cell among the plurality of batter cells having the detected number equal to or greater than a predetermined detected number as the defective battery cell.

The battery pack may further include an alarm part configured to transmit an alarm signal to the outside when the battery cell determined as a defect in the defective battery cell determination module is present.

The internal resistance value may be a direct current internal resistance (DCIR) value calculated by a DCIR calculation method.

In accordance with another exemplary embodiment, a method for detecting a defective battery cell of a battery pack including a plurality of battery cells includes: repeatedly charging the battery pack for a predetermined time; an internal resistance value calculation process of calculating an internal resistance value for each of the plurality of battery cells by a battery management system (BMS) directly after each charging process; a detected number counting process of detecting, by the BMS, a battery cell having a biggest internal resistance value of the plurality of battery cells each time the battery pack is charged and counting a detected number of times each battery cell has the biggest internal resistance value among the plurality of battery cells; and a defective battery cell determination process of determining, by the BMS, a battery cell having the greatest number detected as the defective battery cell after repeatedly performing the charging process, the internal resistance value calculation process, and the detected number counting process.

In the defective battery cell determination process, the BMS may determine all battery cells of the battery pack as a normal state when none of the battery cells have a detected number equal to or greater than a predetermined detected number.

In accordance with yet another exemplary embodiment, a method for detecting a. defective battery cell of a battery pack including a plurality of battery cells includes: repeatedly discharging the battery pack for a predetermined time; a direct current internal resistance (DCIR) value calculation process of calculating an internal resistance value for each of the plurality of battery cells by a battery management system (BMS) directly after the discharging process; a detected number counting process of detecting, by the BMS, a battery cell having a biggest internal resistance value of the plurality of battery cells each time the battery pack is discharged and counting a detected number of times each battery cell has the biggest internal resistance value; and a defective battery cell determination process of determining, by the BMS, the battery cell having the greatest number detected as the defective battery cell having the biggest internal resistance value by the BMS after repeatedly performing the discharging process, the internal resistance value calculation process, and the detected number counting process.

In the defective battery cell determination process, the BMS may determine all battery cells of the battery pack as having a normal state when none of the battery cells have a detected equal to or greater than a predetermined detected number is not present.

The method may further include a defective battery cell alarm signal transmitting process of transmitting an alarm signal, which notifies presence of a defective battery cell, to the outside when the battery cell determined as the defective battery cell in the defective battery cell determination process is present.

The internal resistance calculated in the internal resistance value calculation process may be a DCIR value calculated by a DCIR calculation method.

Advantageous Effects

The battery pack in accordance with the exemplary embodiment, which is a device for detecting the undervoltage defective battery cell, may detect the defective battery cell of the battery cells of the battery pack in the early stage.

Also, the exemplary embodiment may resolve a limitation of the reduction in output of the battery pack due to the defective battery cell by detecting the undervoltage defective battery cell in the early stage.

Also, the exemplary embodiment may detect the undervoltage defective battery cell in the early stage to prevent a situation in which as the defective battery cell is generated in one of the battery packs of the energy storage system (ESS), the output of the battery pack including the undervoltage defective battery cell may decrease, and the ESS may not be efficiently used.

Also, the exemplary embodiment may prevent the safety limitation and the ignition, which may be generated when the undervoltage defective battery cell is continuously charged or discharged, by detecting the undervoltage battery cell in the early stage.

MODE FOR CARRYING OUT THE INVENTION

Figure 1:
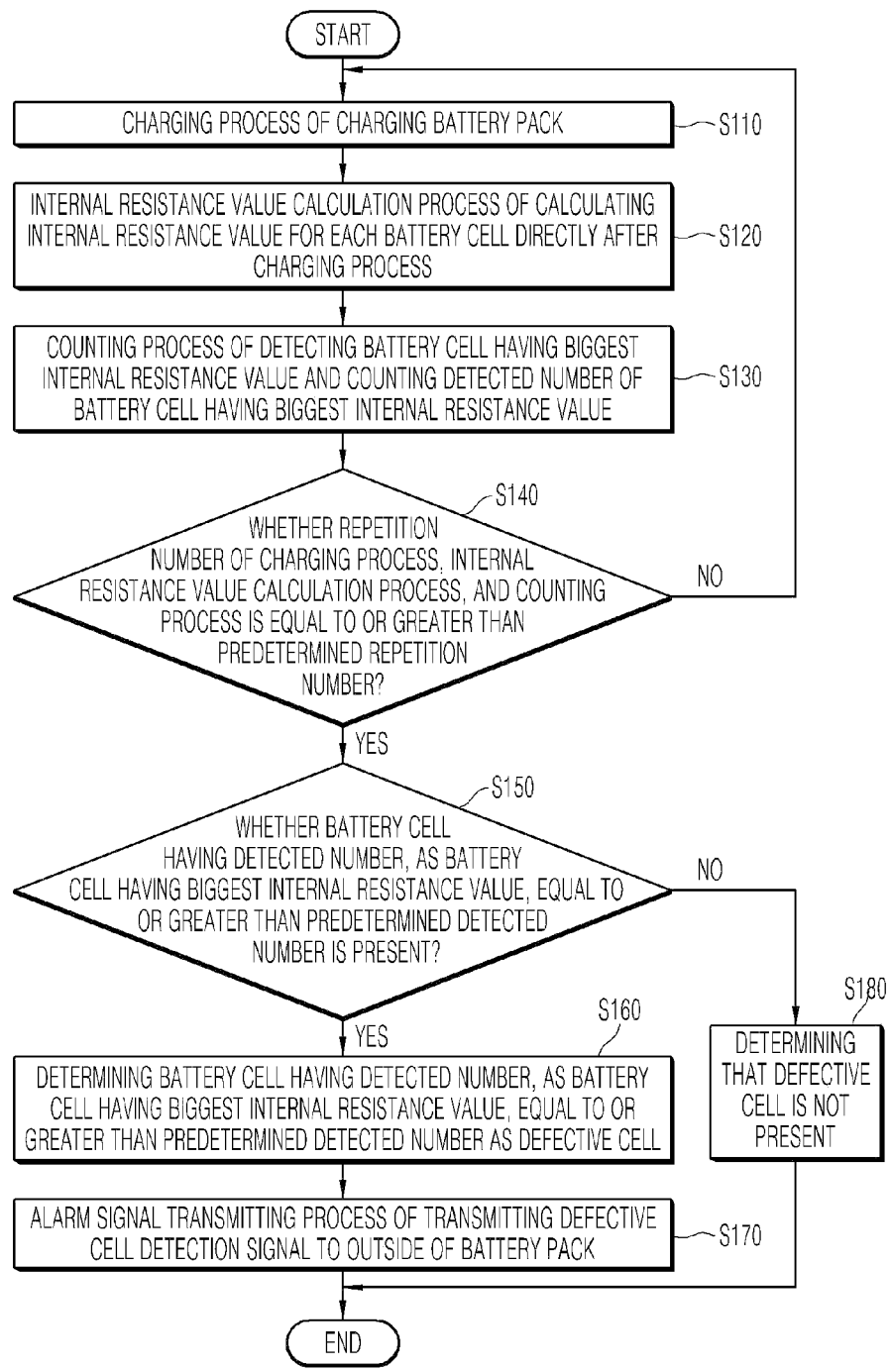
FIG. 1 is a flowchart representing a method for detecting an undervoltage defective battery cell when a battery pack is charged in accordance with an exemplary embodiment.

Hereinafter, preferred embodiments of the present invention will be described in detail with reference to the accompanying drawings in such a manner that the technical idea of the present invention may easily be carried out by a person with ordinary skill in the art to which the invention pertains. The present disclosure may, however, be embodied in different forms and should not be construed as limited to the embodiments set forth herein. In the drawings, anything unnecessary for describing the present disclosure will be omitted for clarity, and also like reference numerals in the drawings denote like elements.

It will be understood that although the terms of first and second are used herein to describe various elements, these elements should not be limited by these terms. The terms are only used to distinguish one component from other components. For example, a first element referred to as a first element in one embodiment can be referred to as a second element in another embodiment. In the following description, the technical terms are used only for explaining a specific exemplary embodiment while not limiting the present disclosure. The terms of a singular form may include plural forms unless referred to the contrary.

In this specification below, when one part is referred to as being 'connected' to another part, it should be understood that the former can be 'directly connected' to the latter, or 'electrically connected to the latter via an intervening part. Furthermore, when it is described that one comprises (or includes or has) some elements, it should be understood that it may comprise (or include or has) only those elements, or it may comprise (or include or have) other elements as well as those elements if there is no specific limitation. In the present specification, "step of ~(ing)" or "step of" does not mean "step for".

Meanwhile, for the terms used in the present disclosure, general terms widely currently used have been selected as possible as they can. In a specific case, terms arbitrarily selected by an applicant may be used. In this case, since the meaning thereof is described in detail in the detailed description of the specification, the present disclosure should be understood in an aspect of meaning of such terms, not the simple names of such terms. In a specific case, terms arbitrarily selected by an applicant may be used. In this case, the meaning thereof is described in detail in the detailed description of the specification. Thus, the present disclosure should be understood in an aspect of meaning of such terms, not the simple names of such terms.

1. Method for Detecting an Undervoltage Defective Battery Cell when Charged in Accordance with an Exemplary Embodiment A typically used method for detecting a defect of an undervoltage battery cell due to deterioration during usage determines a defect only when an undervoltage is substantially detected by measuring a voltage of a battery cell. That is, a state in which a defect is generated in a battery cell is detected after the undervoltage defective battery cell is already generated.

On the other hand, a battery cell, which has a high possibility to be a defective battery cell due to deterioration generated in the battery cell, etc., exhibits a feature in which an internal resistance value measured directly after charged is greater than that measured in a normal battery cell when the charging is performed for a predetermined time. Thus, in an exemplary embodiment, the undervoltage defective battery cell may be detected in an early state by repeating a process of charging a battery pack for a predetermined time, calculating an internal resistance value for each battery cell directly after charged, and detecting a battery cell having a biggest internal resistance value, thereby determining the battery cell, which has a greatest number detected as the battery cell having the biggest internal resistance value, as the undervoltage defective battery cell.

FIG. 1 is a flowchart representing a method for detecting the undervoltage defective battery cell when the battery pack is charged in accordance with an exemplary embodiment.

Hereinafter, the method for detecting the undervoltage defective battery cell when the battery pack is charged in accordance with an exemplary embodiment will be described with reference to FIG. 1.

The method for detecting the undervoltage defective battery cell when the battery pack is charged in accordance with an exemplary embodiment may include: a charging process S110 of charging the battery pack for a predetermined time; an internal resistance value calculation process S120 of calculating an internal resistance value of each of the plurality of battery cells directly after the charging process S110; a detected number counting process S130 of detecting a battery cell having a biggest internal resistance value of the plurality of battery cells and counting the detected number as the battery cell having the biggest internal resistance value; and a defective battery cell determination process S150, S160, and S170 of determining a battery cell having a greatest number detected as the battery cell having the biggest internal resistance value in a battery management system (BMS) after a process S140 of repeating the charging process S110, the internal resistance value calculation process S120, and the detected number counting process S130 at a frequency of a predetermined time with a predetermined repeated number.

The internal resistance calculated in the internal resistance value calculation process may be a DCIR value measured by a direct current internal resistance (DCIR) method.

The DCIR value may be calculated for each battery cell by using a method of converting a voltage and current variation amount into a resistance value in the BMS. A technique of calculating the DCIR for each battery cell is a well-known method.

The defective battery cell determination process S150, S160, and S170 performs a process S180 of determining all battery cells of the battery pack as a normal state when a battery cell having the detected number, which is the number detected as the battery cell having the biggest internal resistance value, equal to or greater than a predetermined detected number, is not present.

The predetermined detected number may be determined according to a predetermined number of repeating the charging process S110, the internal resistance value calculation process S120, and the detected number counting process S130, and each of the predetermined repetition times and the predetermined detected number may be a value that is differently set according to a capacity and a usage purpose of the battery cell.

For example, the predetermined detected number may be the number corresponding to approximately 80% or more of the predetermined repetition times of repeating the charging process, the internal resistance value calculation process, and the detected number counting process.

In a particular embodiment, when first to fifth battery cells have the detected number, which is the number detected as the battery cell having the biggest internal resistance value, of 0 times, 0 times, four times, one times, and 0 times, respectively, in a process of charging the battery pack including the first to fifth battery cells at five times, since the third battery cell has the four detected number as the battery cell having the biggest internal resistance value, and this repetition number is approximately 80% or more of the five repetition number, the third battery cell may be determined as a defective battery cell.

When the defective battery cell is detected in the defective battery cell determining process, an alarm signal transmitting process S170 of notifying presence of a defective battery cell to the outside may be further provided.

For example, the alarm signal transmitting process may notify the presence of the defective battery cell to the outside by using a light signal or a sound signal.

2. Method for Detecting a Defective Battery Cell when Discharged in Accordance with Another Exemplary Embodiment A typically used method for detecting a defect of an undervoltage battery cell due to deterioration during usage determines a defect only when an undervoltage is substantially detected by measuring a voltage of a battery cell. That is, a state in which a defect is generated in a battery cell is detected after the undervoltage defective battery cell is already generated.

On the other hand, a battery cell, which has a high possibility to be a defective battery cell due to deterioration generated in the battery cell, etc., exhibits a feature in which a DCIR value measured directly after discharged is greater than an internal resistance value measured in a normal battery cell when the discharging is performed for a predetermined time. Thus, in another exemplary embodiment, the undervoltage defective battery cell may be detected in an early state by repeating a process of charging a battery pack for a predetermined time, calculating an internal resistance value for each battery cell directly after discharged, and detecting a battery cell having a biggest internal resistance value, thereby determining the battery cell, which has the greatest number detected as the battery cell having the biggest internal resistance value, as the undervoltage defective battery cell.

Figure 2:
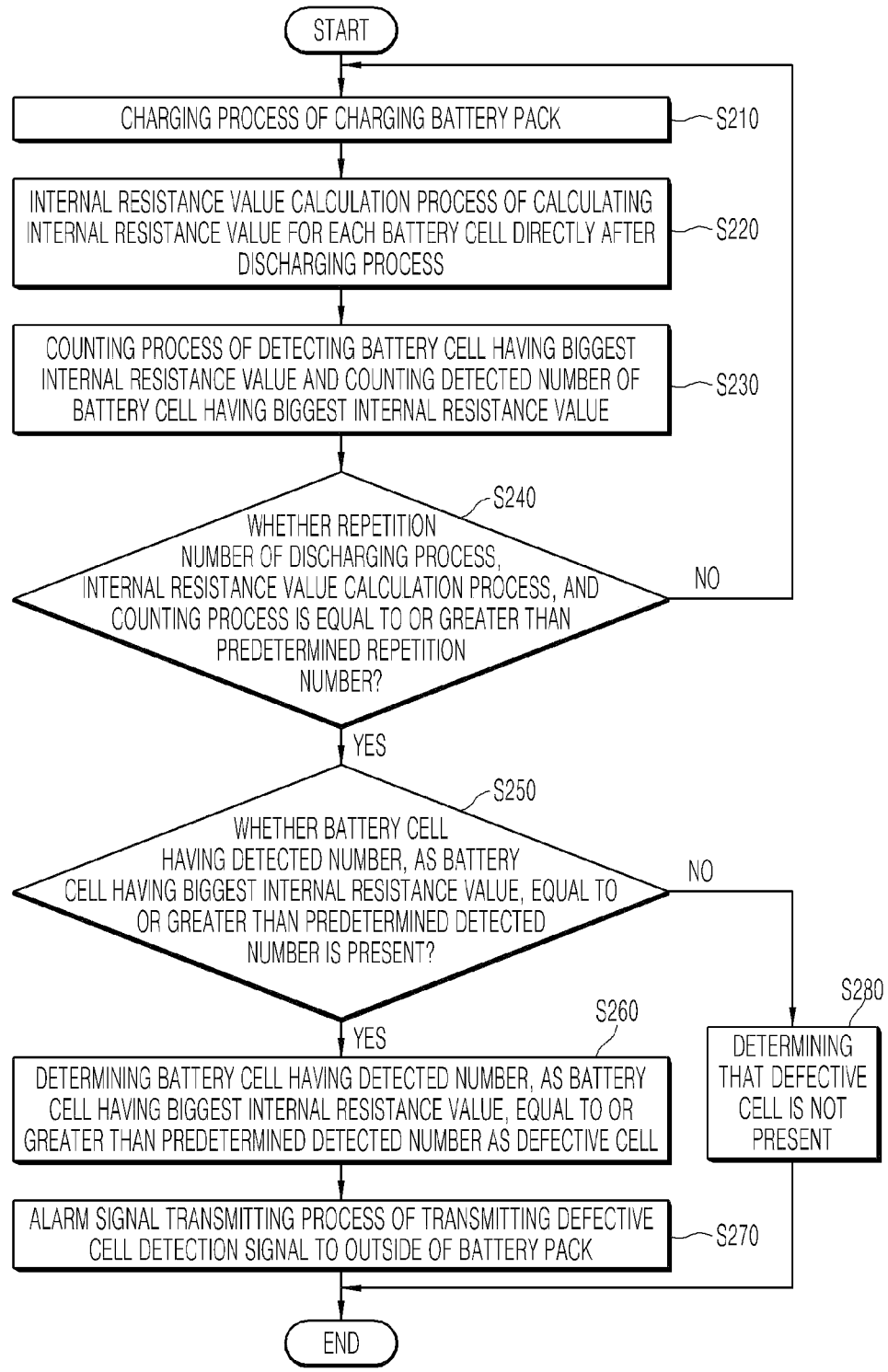
FIG. 2 is a flowchart representing a method for detecting an undervoltage defective battery cell when the battery pack is discharged in accordance with another exemplary embodiment.

FIG. 2 is a flowchart representing a method for detecting the undervoltage defective battery cell when the battery pack is discharged in accordance with another exemplary embodiment.

Hereinafter, the method for detecting the undervoltage defective battery cell when the battery pack is discharged in accordance with another exemplary embodiment will be described with reference to FIG. 2.

The method for detecting the undervoltage defective battery cell when the battery pack is discharged in accordance with another exemplary embodiment may include: a discharging process S210 of discharging the battery pack for a predetermined time; an internal resistance value calculation process S220 of calculating an internal resistance value of each of the plurality of battery cells directly after the discharging process S210; a detected number counting process S230 of detecting a battery cell having a biggest internal resistance value of the plurality of battery cells and counting the detected number as the battery cell having the biggest internal resistance value; and a defective battery cell determination process S250, S260, and S270 of determining a battery cell having the greatest detected number of the battery cell having the biggest internal resistance value in a BMS after a process S140 of repeating the discharging process S210, the internal resistance value calculation process S220, and the detected number counting process S230 at a frequency of a predetermined time with a predetermined repeated number.

The internal resistance calculated in the internal resistance value calculation process S220 may be a DCIR value calculated by the direct current internal resistance (DCIR) method.

The DCIR value may be calculated for each battery cell by using the method of converting a voltage and current variation amount into a resistance value in the BMS. The technique of calculating the DCIR for each battery cell is a well-known method.

The defective battery cell determination process S250, S260, and S270 performs a process S280 of determining all battery cells of the battery pack as a normal state when a battery cell, in which the detected number as the battery cell having the biggest internal resistance value is equal to or greater than a predetermined detected number, is not present.

The predetermined detected number may be determined according to a predetermined number of repeating the discharging process, the internal resistance value calculation process, and the detected number counting process, and each of the predetermined repetition times and the predetermined detected number may be a value that is differently set according to a capacity and a usage purpose of the battery cell.

For example, the predetermined detected number may be the number corresponding to approximately 80% or more of the predetermined repetition times of repeating the discharging process, the internal resistance value calculation process, and the detected number counting process.

In a particular embodiment, when first to fifth battery cells have the detected number, which is the number detected as the battery cell having the biggest internal resistance value, of 0 times, 0 times, four times, one times, and 0 times, respectively, in a process of discharging the battery pack including the first to fifth battery cells at five times, since the third battery cell has the four detected number as the battery cell having the biggest internal resistance value, and this repetition number is approximately 80% or more of the five repetition number, the third battery cell may be determined as a defective battery cell.

When a battery cell determined as a defective battery cell is present in the defective battery cell determining process, an alarm signal transmitting process S270 of notifying presence of a defective battery cell to the outside may be further provided.

For example, the alarm signal transmitting process may notify the presence of the defective battery cell to the outside by using a light signal or a sound signal.

3. Battery Pack in Accordance with an Exemplary Embodiment

Figure 3:
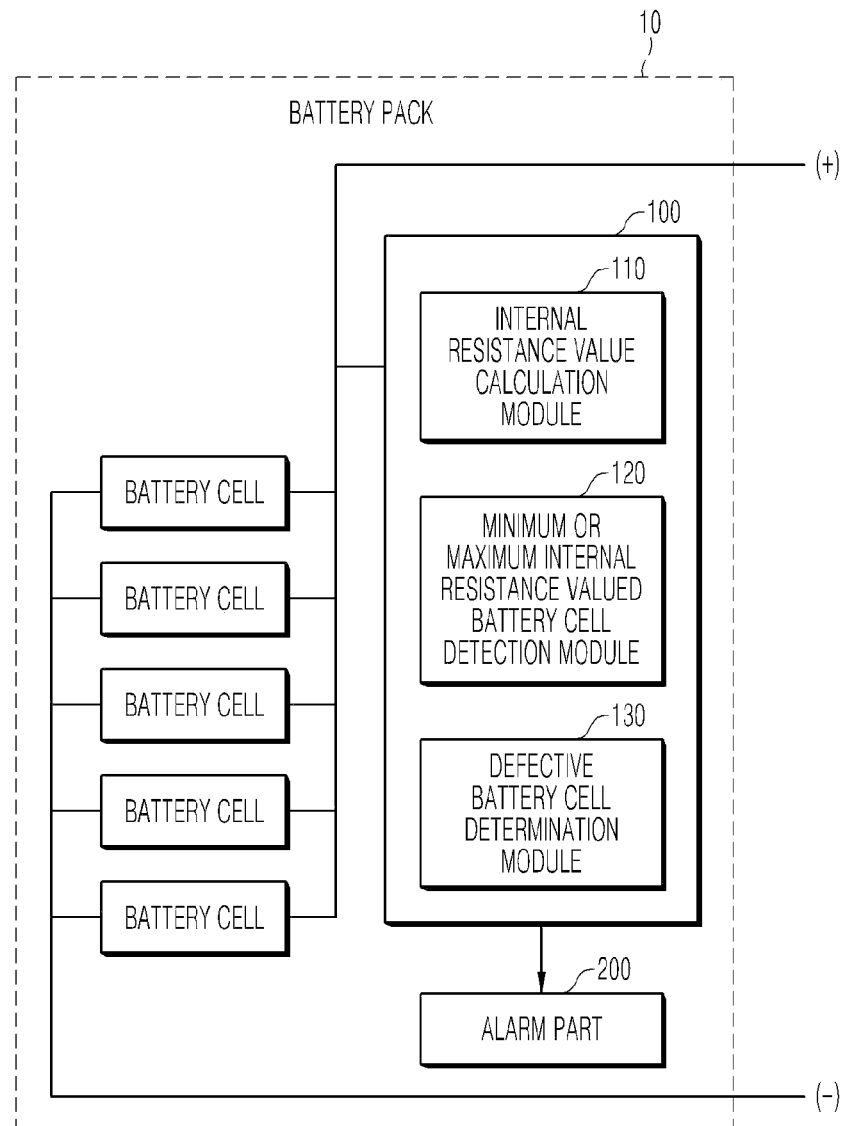
FIG. 3 is a view showing a configuration of a battery pack in accordance with an exemplary embodiment.

FIG. 3 is a view showing a configuration of a battery pack in accordance with an exemplary embodiment.

Hereinafter, the battery pack in accordance with an exemplary embodiment will be described with reference to FIG. 3.

A battery pack 10 in accordance with an exemplary embodiment may be applied with the above-described method for detecting a defective battery cell in accordance with an exemplary embodiment and the method for detecting a defective battery cell in accordance with another exemplary embodiment.

A battery pack in accordance with another exemplary embodiment may include a battery management system (BMS) 100 controlling a plurality of battery cells and the battery pack.

Particularly, the BMS 100 may include: an internal resistance value calculation module 110 calculating an internal resistance value for each battery cell directly after the battery pack is charged or discharged for a predetermined time; a maximum internal resistance valued battery cell detection module 120 detecting a battery cell having a maximum internal resistance value of the calculated internal resistance values for each battery cell; and a defective battery cell determination module 130 determining a defective battery cell on the basis of the detected number as the battery cell having the maximum internal resistance value.

Here, the internal resistance value calculation module 110 may perform the process of calculating the internal resistance value directly after the battery pack is charged or discharged for the predetermined time whenever the battery pack is charged or discharged.

In other words, the internal resistance value calculation module 110 may calculate the internal resistance value one times when the battery pack is charged one times and calculate the internal resistance value five times when the battery pack is charged five times.

Also, the maximum internal resistance valued battery cell detection module 120 may detect the battery cell having the maximum internal resistance value of the calculated internal resistance values directly after the battery pack is charged or discharged for a predetermined time and count the detected number of the battery cell detected as the battery cell having the maximum internal resistance value.

Also, when the defective battery cell determination module 130 may determine a battery cell having the detected number, which is the number detected as the battery cell having the maximum internal resistance value, equal to or greater than a predetermined detected number is present directly after the battery pack is charged or discharged, the battery cell having the detected number, which is the number detected as the battery cell having the maximum internal resistance value, equal to or greater than the predetermined detected number may be determined as a defective battery cell.

In a particular embodiment, when first to fifth battery cells have the detected number, which is the number detected as the battery cell having the biggest internal resistance value, of 0 times, 0 times, four times, one times, and 0 times, respectively, in a process of charging the battery pack including the first to fifth battery cells at five times, since the third battery cell has the four detected number as the battery cell having the biggest internal resistance value, and this repetition number is approximately 80% or more of the five repetition number, the third battery cell may be determined as the defective battery cell.

Here, the battery pack may further include an alarm part 200 transmitting an alarm signal to the outside when a battery cell determined as the defective battery cell in the defective battery cell determination module 130 is present.

For example, the alarm part may include at least one of a light emitting element outputting a light signal when a defect signal is inputted from the defective battery cell determination module and a speaker outputting a sound signal when a defect signal is inputted from the defective battery cell determination module.

As described above, the technical idea of the present invention has been specifically described with respect to the above embodiments, but it should be noted that the foregoing embodiments are provided only for illustration while not limiting the present invention. Various embodiments may be provided to allow those skilled in the art to understand the scope of the preset invention, but the present invention is not limited thereto.

What is claimed is:

1. A battery pack comprising a plurality of battery cells, the battery pack comprising a battery management system (BMS) configured to control the battery pack,
   wherein the BMS comprises:
      an internal resistance value calculation module configured to calculate an internal resistance value for each battery cell directly after each time the battery pack is charged or discharged, during a predetermined period of time;

a maximum internal resistance valued battery cell detection module configured to:
    detect a battery cell among the plurality of battery cells having a biggest internal resistance value of the calculated internal resistance values, each time the battery pack is charged or discharged, and
    count a detected number of times each battery cell has the biggest internal resistance value; and
a defective battery cell determination module configured to determine a defective battery cell as the battery cell having the greatest detected number after the charging or discharging process of the battery pack is repeatedly performed at a frequency of a predetermined time with a predetermined repetition time.

2. The battery pack of claim 1, wherein the internal resistance value calculation module repeatedly calculates the internal resistance value directly after the battery pack is charged or discharged for the predetermined period of time, and
the maximum internal resistance valued battery cell detection module detects the battery cell having the biggest internal resistance value of the calculated internal resistance values directly after the battery pack is charged or discharged for the predetermined period of time and counts the detected number of the battery cell detected as the battery cell having the maximum internal resistance value.

3. The battery pack of claim 2, wherein the defective battery cell determination module determines the battery cell among the plurality of battery cells having the detected number equal to or greater than a predetermined detected number as the defective battery cell.

4. The battery pack of claim 1, wherein the battery pack further comprises an alarm part configured to transmit an alarm signal to the outside when the battery cell determined as a defect in the defective battery cell determination module is present.

5. The battery pack of claim 1, wherein the internal resistance value is a direct current internal resistance (DCIR) value calculated by a DCIR calculation method.

6. A method for detecting a defective battery cell of a battery pack comprising a plurality of battery cells, the method comprising:
    repeatedly charging the battery pack for a predetermined time;
    an internal resistance value calculation process of calculating an internal resistance value for each of the plurality of battery cells by a battery management system (BMS) directly after each charging process;
    a detected number counting process of detecting, by the BMS, a battery cell having a biggest internal resistance value of the plurality of battery cells each time the battery pack is charged and counting a detected number of times each battery cell has the biggest internal resistance value among the plurality of battery cells; and
    a defective battery cell determination process of determining a battery cell having the greatest number detected as the battery cell having the biggest internal resistance value by the BMS after repeatedly performing the charging process, the internal resistance value calculation process, and the detected number counting process at a frequency of a predetermined time with predetermined repetition times.

7. The method of claim 6, wherein in the defective battery cell determination process, the BMS determines all battery cells of the battery pack as a normal state when none of the battery cells have a detected number equal to or greater than a predetermined detected number.

8. A method for detecting a defective battery cell of a battery pack comprising a plurality of battery cells, the method comprising:
    repeatedly discharging the battery pack for a predetermined time;
    a direct current internal resistance (DCIR) value calculation process of calculating an internal resistance value for each of the plurality of battery cells by a battery management system (BMS) directly after the discharging process;
    a detected number counting process of detecting, by the BMS, a battery cell having a biggest internal resistance value of the plurality of battery cells each time the battery pack is discharged and counting a detected number of times each battery cell has the biggest internal resistance value; and
    a defective battery cell determination process of determining a battery cell having the greatest number detected as the battery cell having the biggest internal resistance value by the BMS after repeatedly performing the discharging process, the internal resistance value calculation process, and the detected number counting process at a frequency of a predetermined time with predetermined repetition times.

9. The method of claim 8, wherein in the defective battery cell determination process, the BMS determines all battery cells of the battery pack as having a normal state when none of the battery cells have a detected number equal to or greater than a predetermined detected number.

10. The method of any one of claim 9, wherein the internal resistances calculated in the internal resistance value calculation process is a DCIR value calculated by a DCIR calculation method.

11. The method of claim 8, further comprising a defective battery cell alarm signal transmitting process of transmitting an alarm signal, which notifies presence of a defective battery cell, to the outside when the battery cell determined as the defective battery cell in the defective battery cell determination process is present.

* * * * *